(12) United States Patent
Chen et al.

(10) Patent No.: US 11,688,620 B2
(45) Date of Patent: *Jun. 27, 2023

(54) SHIFTLESS WAFER BLADES

(71) Applicant: Taiwan Semiconductor Manufacturing Co., Ltd., Hsin-Chu (TW)

(72) Inventors: Chien-Chih Chen, Hsin-Chu (TW); Yao-Min Yu, Hsin-Chu (TW); Ching-Ling Lee, Hsin-Chu (TW); Ren-Dou Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/846,431

(22) Filed: Jun. 22, 2022

(65) Prior Publication Data

US 2022/0392796 A1    Dec. 8, 2022

Related U.S. Application Data

(63) Continuation of application No. 16/908,153, filed on Jun. 22, 2020, now Pat. No. 11,380,569, which is a continuation of application No. 16/123,413, filed on Sep. 6, 2018, now Pat. No. 10,699,931.

(30) Foreign Application Priority Data

Sep. 6, 2017   (CN) .......................... 201710795387.8

(51) Int. Cl.
*H01L 21/677*   (2006.01)
*H01L 21/687*   (2006.01)
*B25J 11/00*    (2006.01)

(52) U.S. Cl.
CPC ..... *H01L 21/67766* (2013.01); *B25J 11/0095* (2013.01); *H01L 21/67742* (2013.01); *H01L 21/67778* (2013.01); *H01L 21/68707* (2013.01)

(58) Field of Classification Search
CPC ......... H01L 21/67766; H01L 21/67742; H01L 21/67778; H01L 21/68707; B25J 11/0095; B25J 15/0014; Y10S 414/141
See application file for complete search history.

(56) References Cited

U.S. PATENT DOCUMENTS

| | | |
|---|---|---|
| 4,900,214 A | 2/1990 | Ben |
| 5,647,626 A | 7/1997 | Chen |
| 5,755,469 A | 5/1998 | Choi |

(Continued)

FOREIGN PATENT DOCUMENTS

| | | |
|---|---|---|
| JP | 2010-239023 A | 10/2010 |
| TW | 505945 B | 10/2002 |

(Continued)

*Primary Examiner* — Dean J Kramer
(74) *Attorney, Agent, or Firm* — Duane Morris LLP

(57) ABSTRACT

In an embodiment, a system includes: a cassette comprising a slit opening configured to house a wafer; a blade configured to move the wafer to and from the slit opening by extending into the slit opening, wherein a blade thickness of the blade is at most ⅔ of a height of the slit opening and wherein the blade is configured to secure the wafer within a pocket on the blade that is at least ⅔ of a wafer thickness of the wafer.

20 Claims, 15 Drawing Sheets

(56) References Cited

U.S. PATENT DOCUMENTS

| | | | |
|---|---|---|---|
| 5,907,895 A | 6/1999 | Yu | |
| 6,024,393 A | 2/2000 | Shamlou | |
| 6,163,972 A | 12/2000 | Hsu | |
| 6,187,103 B1 | 2/2001 | Huang et al. | |
| 6,260,894 B1 | 7/2001 | Minnick | |
| 6,267,423 B1 | 7/2001 | Marohl | |
| 6,276,731 B1 | 8/2001 | Hino | |
| 6,454,327 B1 | 9/2002 | Chang | |
| 6,709,218 B1 | 3/2004 | Freerks et al. | |
| 6,906,790 B2 | 6/2005 | Kikuchi | |
| 7,011,484 B2 | 3/2006 | Lee | |
| 7,878,562 B2 * | 2/2011 | Hamano | H01L 21/68707 |
| | | | 294/902 |
| 8,672,602 B2 | 3/2014 | Asari | |
| 8,864,202 B1 * | 10/2014 | Schrameyer | B25J 15/0014 |
| | | | 294/902 |
| 8,985,935 B2 | 3/2015 | Tan | |
| 9,349,643 B2 | 5/2016 | Waterworth | |
| 9,434,076 B2 | 9/2016 | Tseng | |
| 9,443,752 B2 | 9/2016 | Brodine | |
| 10,699,931 B2 | 6/2020 | Chen | |
| 11,380,569 B2 * | 7/2022 | Chen | H01L 21/67253 |
| 2006/0113806 A1 | 6/2006 | Tsuji | |
| 2009/0065995 A1 * | 3/2009 | Pimentel Serrano | H01L 21/67742 |
| | | | 294/213 |
| 2016/0111311 A1 | 4/2016 | Lee | |
| 2016/0264365 A1 * | 9/2016 | Maruyama | H01L 21/68707 |

FOREIGN PATENT DOCUMENTS

| | | |
|---|---|---|
| TW | 201133701 A | 10/2011 |
| TW | 201526150 A | 7/2015 |

\* cited by examiner

SHIFTLESS WAFER BLADES

CROSS-REFERENCE TO RELATED APPLICATIONS

The present application is a continuation of U.S. patent application Ser. No. 16/908,153, filed Jun. 22, 2020, which is a continuation of U.S. patent application Ser. No. 16/123,413, filed on Sep. 6, 2018, now U.S. Pat. No. 10,699,931, which claims priority to China Application No. 201710795387.8 filed Sep. 6, 2017, each of which is incorporated by reference herein in its entirety.

BACKGROUND

In the fabrication processes for a semiconductor device, numerous processing steps must be carried out on a semiconductor substrate before the device is fabricated. The numerous processes may be as many as several hundred processing steps. Each processing step is executed in a process chamber, such as an etcher, a physical vapor deposition chamber (a.k.a., a sputtering chamber), a chemical vapor deposition chamber, and the like.

In the vast majority of the processing steps, a special environment of either a high vacuum, a low vacuum, a gas plasma or other chemical environment may be provided for the wafer. For instance, in a sputtering chamber, a high vacuum environment may first be provided surrounding the wafer such that metal particles sputtered from a metal target can travel to and deposit on an exposed surface of the wafer. In other process chambers, such as in a plasma enhanced chemical vapor deposition chamber, a plasma cloud of a reactant gas or gases is formed over a wafer positioned in a chamber such that deposition of a chemical substance can occur on the wafer. During any processing step, the wafer must also be kept in an extremely clean environment without the danger of being contaminated. The processing of a wafer therefore must be conducted in a hermetically sealed environment that is completely isolated from the ambient atmosphere.

In a wafer processing system, the handling of wafers between the various chambers must be carefully conducted to avoid damage to the wafers. To accomplish such purpose, the wafer is handled by a wafer transfer system. The wafer transfer system may consist mainly of a robotic handler which handles all wafer transfers by a single, planar, two-axis, random access, cassette-to-cassette motion. A major component of the robotic handler is a wafer blade. The wafer blade may operate under a high-temperature transfer environment of up to 700° Celsius, for example, without incurring contamination.

The positioning of a wafer on the wafer blade may result in two surfaces being positioned face-to-face. When the two surfaces are positioned face to face, the wafer may slip off the wafer blade during transport and the contact between the wafer blade and wafer may cause damage to the wafer and/or the wafer blade. Also, when a wafer falls off the blade, the wafer may be either severely damaged or broken, resulting in a total loss.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
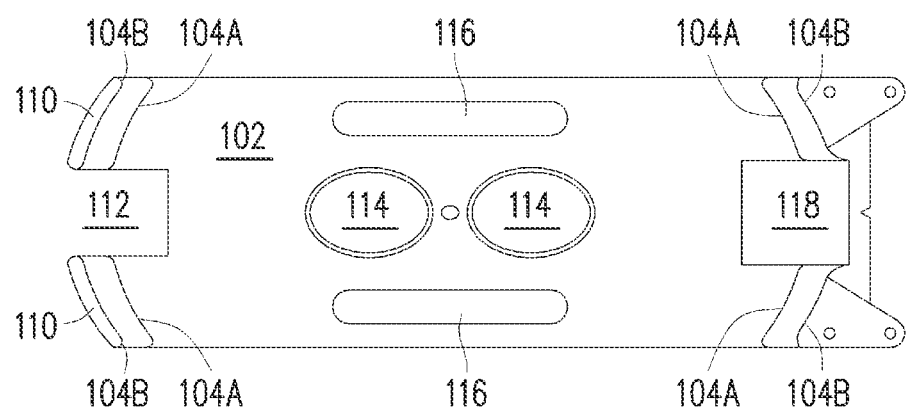
FIG. 1A is a plan view of a shiftless wafer blade, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a shiftless wafer blade. A shiftless wafer blade may include a deep wafer pocket, a thin profile, and dulled corners. The deep wafer pocket may have a depth that is at least $\frac{2}{3}$ of a thickness of a wafer configured to sit on the shiftless wafer blade (e.g., within the deep wafer pocket of the shiftless wafer blade). Having a deep wafer pocket allows a wafer to be more secure within the deep wafer pocket than with a pocket that is less than $\frac{2}{3}$ of a thickness of the wafer. Also, a wafer may be housed within a slit opening of a cassette for transport with other wafers in the cassette. The shiftless wafer blade may have a thin profile that is at most (e.g., at or less than) $\frac{2}{5}$ of a height of the slit opening.

Lastly, the shiftless wafer blade may secure a wafer using contours or formations along the surface of the shiftless wafer blade. For example, the contours may form an outline for the deep wafer pocket. The corners of the shiftless wafer blade may be rounded, or greater than 90 degrees between intersecting surfaces to prevent damage to the corners of the shiftless wafer blade and damage to other objects (e.g., the wafer) from contact with the shiftless wafer blade. In certain embodiments, the shiftless wafer blade may be configured to extend into a slit opening to an extension depth and have all outside corners of the wafer blade to the extension depth be greater than 90 degrees between intersecting surfaces (e.g., as rounded corners). In further embodiments, the shiftless wafer blade may have all exposed outside corners (e.g., outside corners that can be contacted at a surface not covered by a robotic handler) be greater than 90 degrees between intersecting surfaces (e.g., as rounded corners). The angles may be measured from within the shiftless wafer blade. The outside corner may also describe a tapered sidewall. The term "intersecting surfaces" may refer to a surface of a generally uniform gradient or slope, and the term "corner" may refer to a transition between the surfaces.

FIG. 1A is a plan view of a shiftless wafer blade 102, in accordance with some embodiments. The shiftless wafer blade 102 may have various contours which provide structures on which a wafer may rest while being secured and transported by the shiftless wafer blade 102. These contours may include a lower pocket contour 104A and an upper pocket contour 104B. As will be illustrated and discussed further below, a wafer may rest within a deep wafer pocket between the upper pocket contour 104B and the lower pocket contour 104A. Visualized another way, the upper pocket contour 104B and lower pocket contour 104A may form an outline for two concentric circles where the area between the two concentric circles forms the deep wafer pocket on which a wafer may rest. Also, each of the outside corners on the shiftless wafer blade, including those formed by the upper pocket contour 104B and the lower pocket contour 104A, may be rounded, or greater than 90 degrees between intersecting surfaces. These outside corners include corners formed of the contour in both a horizontal and a vertical axis, where the vertical axis is orthogonal to the horizontal axis. As noted above, an inside corner may be a corner formed by two intersecting surfaces at an angle measured from the outside (e.g., external to the shiftless wafer blade) of greater than 180 degrees. These dimensions will be discussed in further detail below.

The shiftless wafer blade 102 may also include forward protrusions 110. These forward protrusions 110 may be separated by a forward opening 112. The forward opening 112 may separate the forward protrusions 110 in order to reduce an amount of material that makes up the shiftless wafer blade 102, thus making the shiftless wafer blade 102 lighter and with less bulk. The forward opening 112 and forward protrusions 110 may be described as being forward due to their being away from a rear portion of the shiftless wafer blade that may be covered by a robotic handler. The robotic handler will be discussed in further detail below. In addition to the forward opening 112, the shiftless wafer blade 102 may include two circular openings 114, two elongated openings 116, and a rear opening 118. Furthermore, the shiftless wafer blade may have an elongated outline that extends further along one axis than another.

Figure 1B:
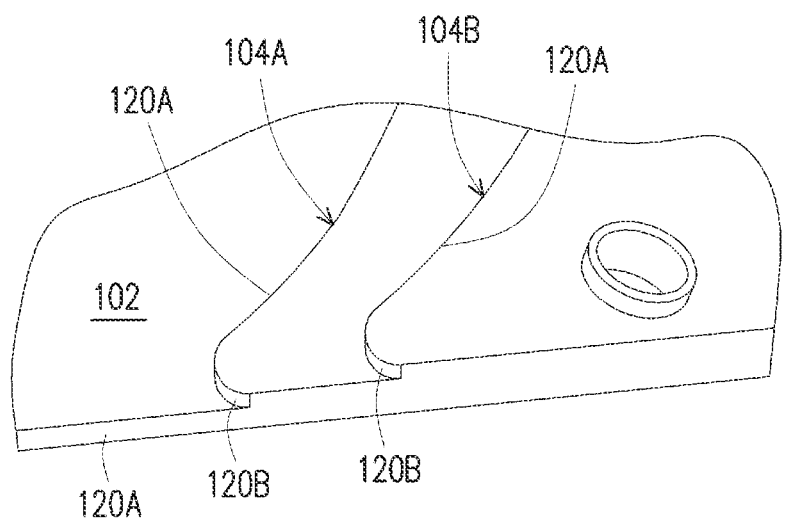
FIG. 1B is a view of certain outside corners of the shiftless wafer blade toward a rear portion of the shiftless wafer blade, in accordance with some embodiments.

FIG. 1B is a view of certain outside corners of the shiftless wafer blade 102 toward a rear portion of the shiftless wafer blade 102, in accordance with some embodiments. The outside corners may be part of the lower pocket contour 104A and the upper pocket contour 104B. More specifically, the both the lower pocket contour 104A and the upper pocket contour 104B may include a vertical outside corner 120A and a horizontal outside corner 120B. The vertical outside corner may be a corner formed by two intersecting surfaces, that intersect more along a horizontal axis than a vertical axis, at an angle measured from within the shiftless wafer blade of greater than 90 degrees. The horizontal outside corner may be a corner fainted by two intersecting surfaces, that intersect more along a vertical axis than a horizontal axis, at an angle measured from within the shiftless wafer blade of greater than 90 degrees. The horizontal axis may be an axis along which a height of the shiftless wafer blade extends.

Figure 1C:
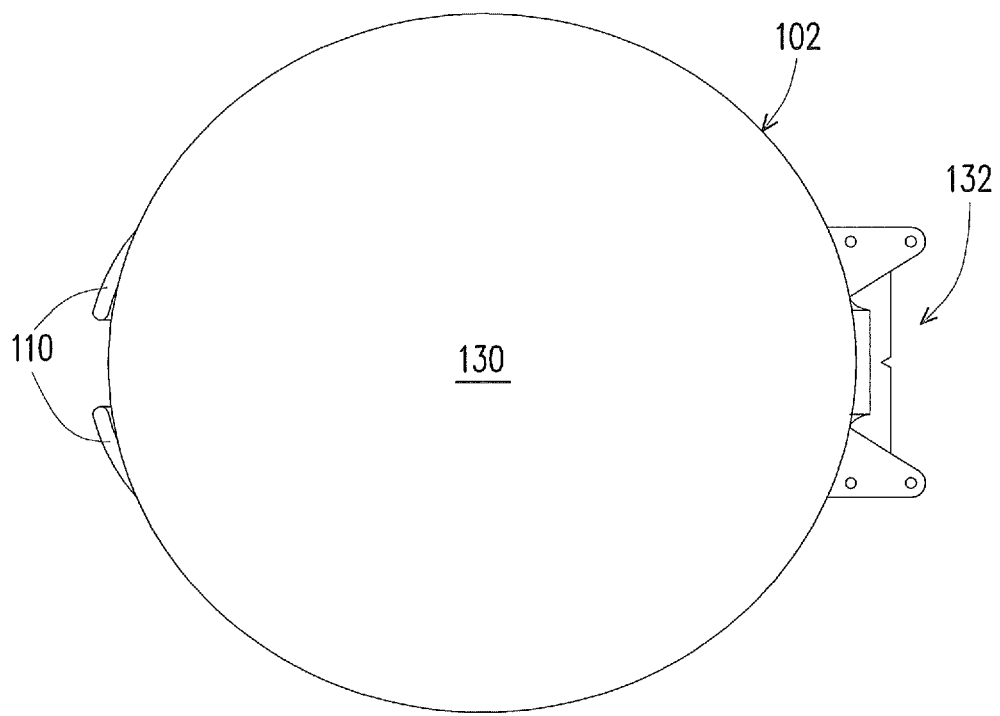
FIG. 1C is a plan view of the shiftless wafer blade with a wafer on top, in accordance with some embodiments.

FIG. 1C is a plan view of the shiftless wafer blade 102 with a wafer 130 on top, in accordance with some embodiments. As noted above, the wafer 130 may rest on the shiftless wafer blade 120 in the deep wafer pocket between the lower pocket contour and the upper pocket contour. Also, portions of the forward protrusions 110 may be exposed from under the wafer 130 and a rear part 132 of the shiftless wafer blade may also be exposed but may be substantially covered by the robotic handler, as will be illustrated below.

Figure 1D:
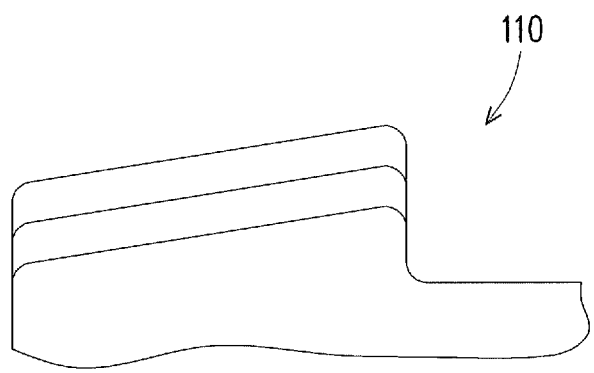
FIG. 1D is a view of one of the forward protrusions with rounded corners, in accordance with some embodiments.

FIG. 1D is a view of one of the forward protrusions 110 with rounded corners, in accordance with some embodiments. As illustrated and discussed above, each of the corners of the forward protrusions may be rounded, or greater than 90 degrees between intersecting surfaces.

Figure 2A:
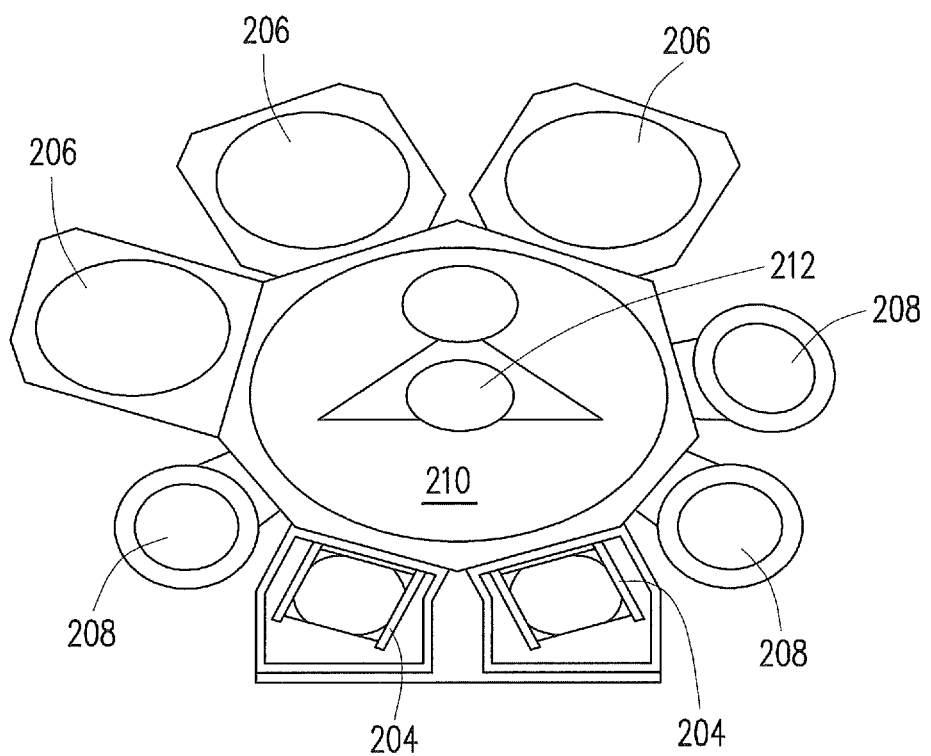
FIG. 2A is a diagram of a wafer transfer system, in accordance with some embodiments.

FIG. 2A is a diagram of a wafer transfer system 202, in accordance with some embodiments. The wafer transfer system 202 may include two cassette load locks 204, three process chambers 206, three cooling chambers 208 and a transfer chamber 210. The transfer chamber 210 may be isolated from the cassette load locks 204, the process chambers 206 and the cooling by slit valves. The transfer chamber 210 may include a robotic handler 212 that includes the above referenced shiftless wafer blade.

Each of the process chambers 206 may be capable of processing a single wafer for achieving wafer-to-wafer repeatability and control. An example of the process chambers 206 may be a rapid thermal processing chamber. The temperatures in the process chambers may be further closed-loop controlled for accuracy.

The handling of wafers between the cassette load locks 204, process chambers 206, cooling chambers 208 and the transfer chamber 210 may be carefully conducted to avoid damage to the wafers. To accomplish such purpose, the wafer is handled by a robotic handler 212. The robotic handler 212 may handle all wafer transfers by a single, planar, two-axis, random access, cassette-to-cassette motion. A major component of the robotic handler 212 is a shiftless wafer blade. In certain embodiments, the shiftless wafer blade may be composed of high-purity quartz to permit high-temperature transfer at up to, for example, about 700° centigrade without incurring contamination. In other embodiments, the shiftless wafer blade may be composed of at least one of: a ceramic (e.g., quartz), a metal (e.g., stainless steel), an aluminum alloy, or aluminum oxide.

Figure 2B:
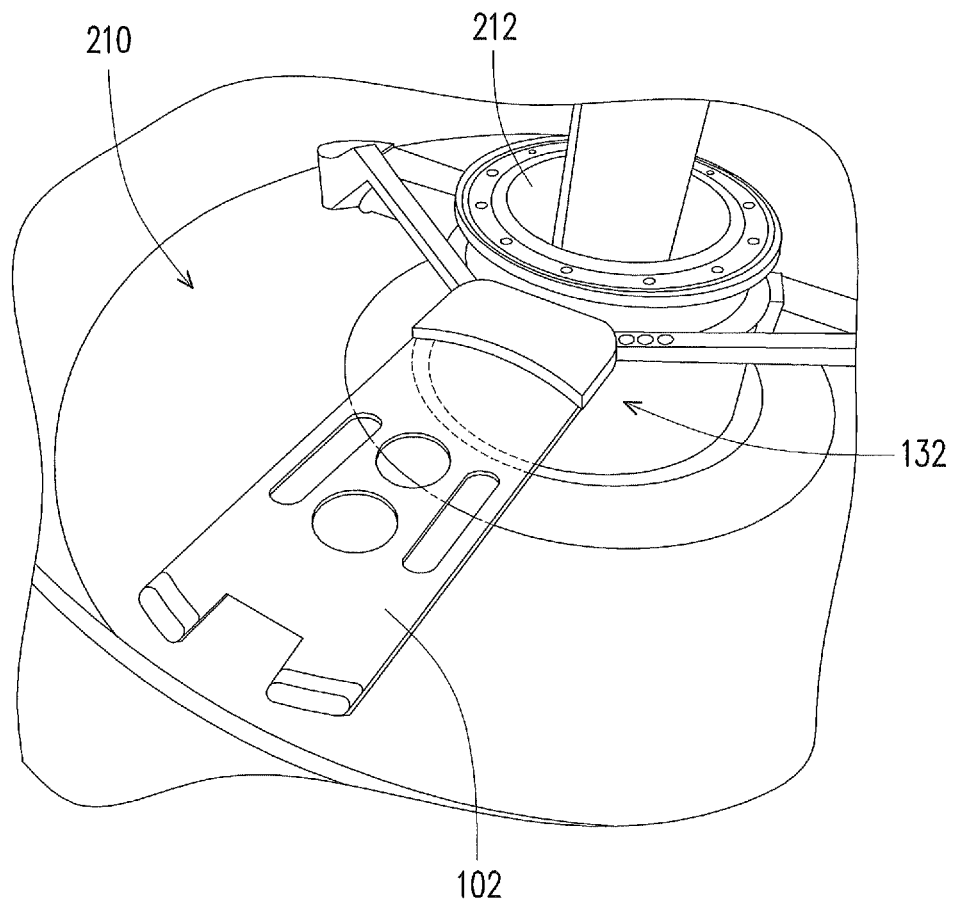
FIG. 2B is a perspective diagram of the transfer chamber of wafer transfer system, in accordance with some embodiments.

FIG. 2B is a perspective diagram of the transfer chamber 210 of wafer transfer system, in accordance with some embodiments. The transfer chamber 210 may include the robotic handler 212 with the shiftless wafer blade 102 attached. The shiftless wafer blade 102 may be attached by having the rear part 132 of the shiftless wafer blade 102 connected to and sandwiched by the robotic handler 212. The connection of the shiftless wafer blade 102 with the robotic handler may be performed in a conventional manner and will not be discussed in detail herein.

Figure 2C:
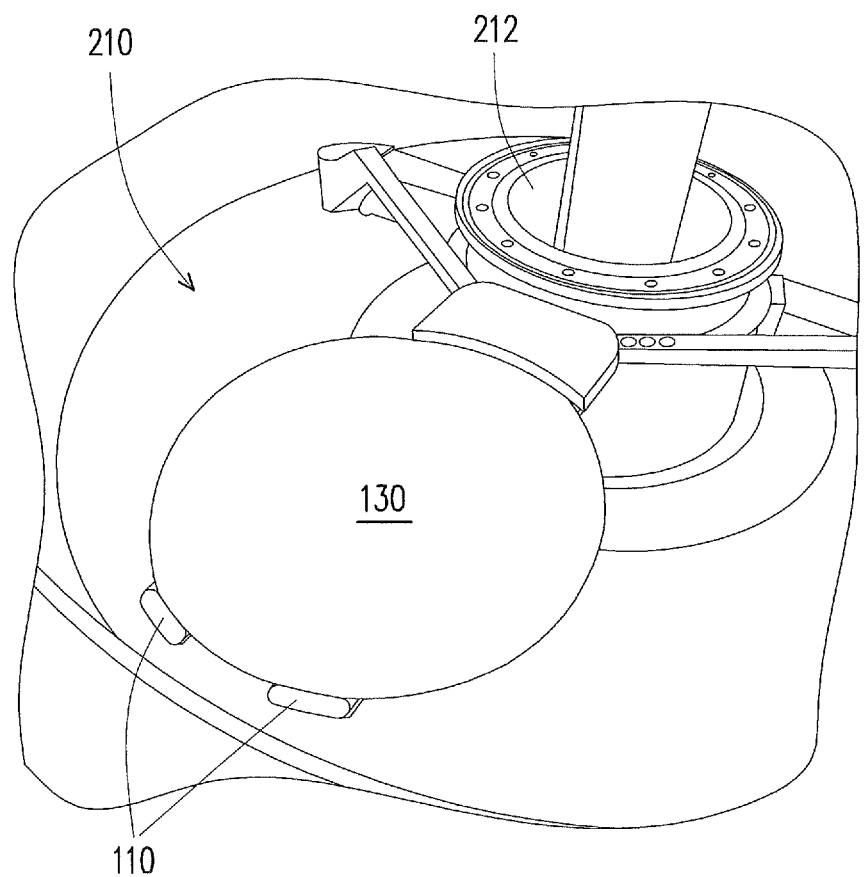
FIG. 2C is a perspective diagram of the transfer chamber with the wafer on top, in accordance with some embodiments.

FIG. 2C is a perspective diagram of the transfer chamber 210 with the wafer 130 on top, in accordance with some embodiments. The combination of the robotic handler 212 and the wafer 130 may generally cover the shiftless wafer blade 102. However, portions of the forward protrusions 110 may be exposed from under the wafer 130.

Figure 2D:
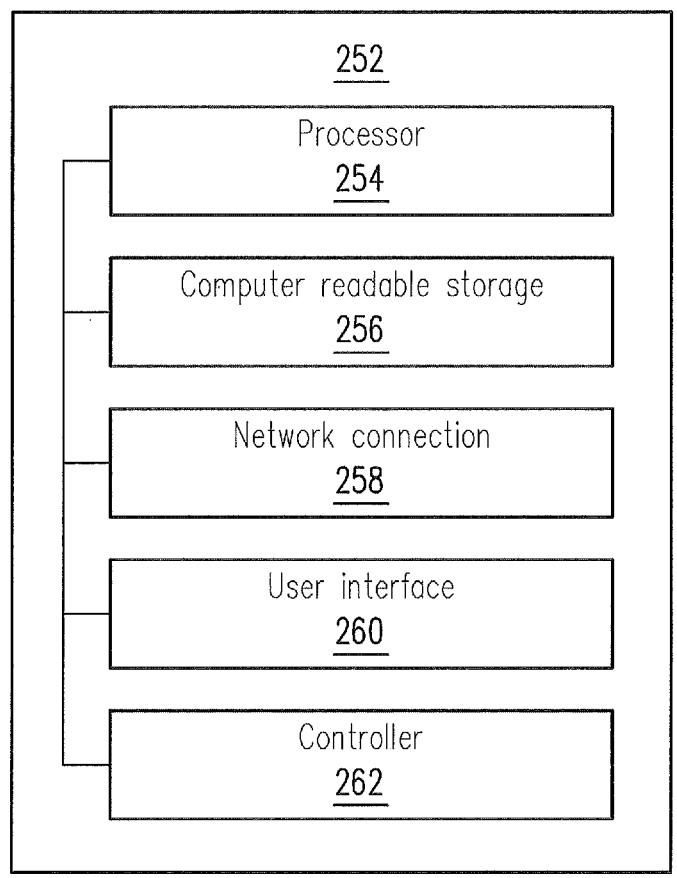
FIG. 2D is a block diagram of various functional modules of the wafer transfer system, in accordance with some embodiments.

FIG. 2D is a block diagram of various functional modules of the wafer transfer system 202, in accordance with some embodiments. These functional modules may be present in addition to the various features of the wafer transfer system discussed above. The wafer transfer system 202 may include a processor 254. In further embodiments, the processor 254 may be implemented as one or more processors.

The processor 254 may be operatively connected to a computer readable storage 256 (e.g., a memory and/or data store), a network connection 258, a user interface 260, and a controller 262. In some embodiments, the computer readable storage 256 may include process logic that may configure the processor 254 to perform the various processes discussed herein. The computer readable storage may also store data, such as operational instructions for a shiftless wafer blade transfer process, identifiers for a wafer, identifiers for a shiftless wafer blade, identifiers for a cassette, and any other parameter or information that may be utilized to perform the various processes discussed herein.

The network connection 258 may facilitate a network connection of the wafer transfer system 202 with various devices and/or components of the wafer transfer system 202 that may communicate within or external to the wafer transfer system 202. In certain embodiments, the network connection 258 may facilitate a physical connection, such as a line or a bus. In other embodiments, the network connection 258 may facilitate a wireless connection, such as over a wireless local area network (WLAN) by using a transmitter, receiver, and/or transceiver. For example, the network connection 258 may facilitate a wireless or wired connection with the processor 254 and the controller 262. Also, the network connection 258 may enable communication between a valve and a shutter actuator, or between a wafer support and rotational ring, as moderated by the processor 254.

The wafer transfer system 202 may also include a user interface 260. The user interface may include any type of interface for input and/or output to an operator of the wafer transfer system 202, including, but not limited to, a monitor, a laptop computer, a tablet, or a mobile device, etc.

The wafer transfer system 202 may include a controller 262. The controller 262 may be configured to control various physical apparatuses that control movement or functionality of the wafer transfer system 202, such as for a robotic handler, a door, a cassette and the like. For example, the controller 262 may control a motor that may move a robotic handler, a door, or a cassette. The controller may be controlled by the processor and may carry out the various aspects of the various processes discussed herein.

Figure 3A:
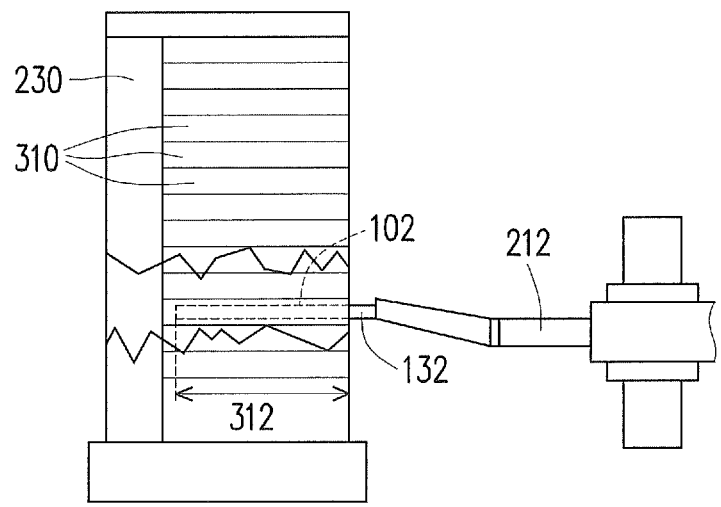
FIG. 3A is a cross sectional view of the wafer transfer system interfacing with a cassette, in accordance with some embodiments.

FIG. 3A is a cross sectional view of the wafer transfer system 202 interfacing with a cassette 230, in accordance with some embodiments. The cassette 230 may be part of the above referenced cassette load locks. The cassette 230 may include multiple slit openings 310 that are each configured to house a wafer. The wafers may be of generally uniform size and shape. Therefore, the slit openings may also each be of generally uniform size and shape.

The robotic handler 212 may be coupled with the shiftless wafer blade 102. The shiftless wafer blade 102 may be attached by having the rear part 132 of the shiftless wafer blade 102 connected to and sandwiched by the robotic handler 212. Accordingly, part of the rear part 132 of the shiftless wafer blade may be within the robotic handler 212 and not exposed to an area external to the robotic handler 212. In certain embodiments, the shiftless wafer blade may have all exposed outside corners (e.g., outside corners that can be contacted at a surface not covered by a robotic handler) be greater than 90 degrees between intersecting surfaces.

In certain embodiments, the shiftless wafer blade 102 may be configured to extend into the slit opening 310 to an extension depth 312 and have all outside corners of the wafer blade to the extension depth be greater than 90 degrees between intersecting surfaces.

Figure 3B:
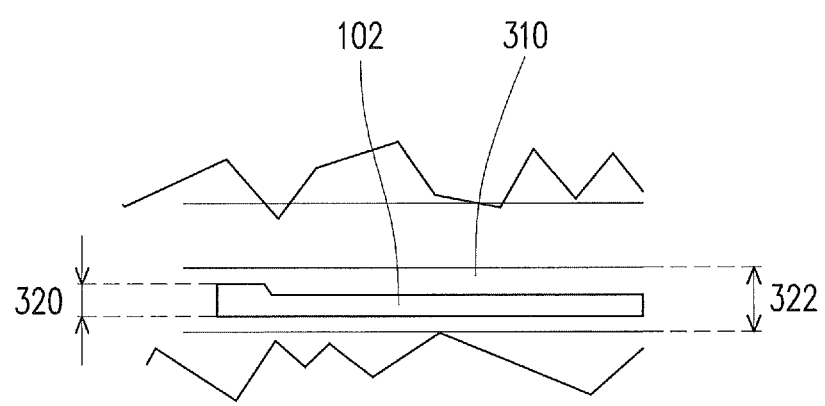
FIG. 3B is a cross section view of the shiftless wafer blade extended into a slit opening, in accordance with some embodiments.

FIG. 3B is a cross sectional diagram of the shiftless wafer blade 102 extended into the slit opening 310, in accordance with some embodiments. When extended into the cassette, the shiftless wafer blade 102 may have a certain amount of clearance both above and below the shiftless wafer blade 102. In certain embodiments, the wafer (not illustrated in FIG. 3B) may be moved in the slit opening 310 from a lower position to an upper position via pins (not illustrated) to extend above the shiftless wafer blade 102 and then be lowered onto the shiftless wafer blade 102 within the deep wafer pocket. The movement of the wafer within the slit opening 310 onto the shiftless wafer blade 102 may be performed in a conventional manner and will not be discussed in further detail herein. As noted above, the shiftless wafer blade may have a thin profile 320 that is at most (e.g., at or less than) ⅔ of a height 322 of the slit opening 310, in accordance with some embodiments.

Figure 3C:
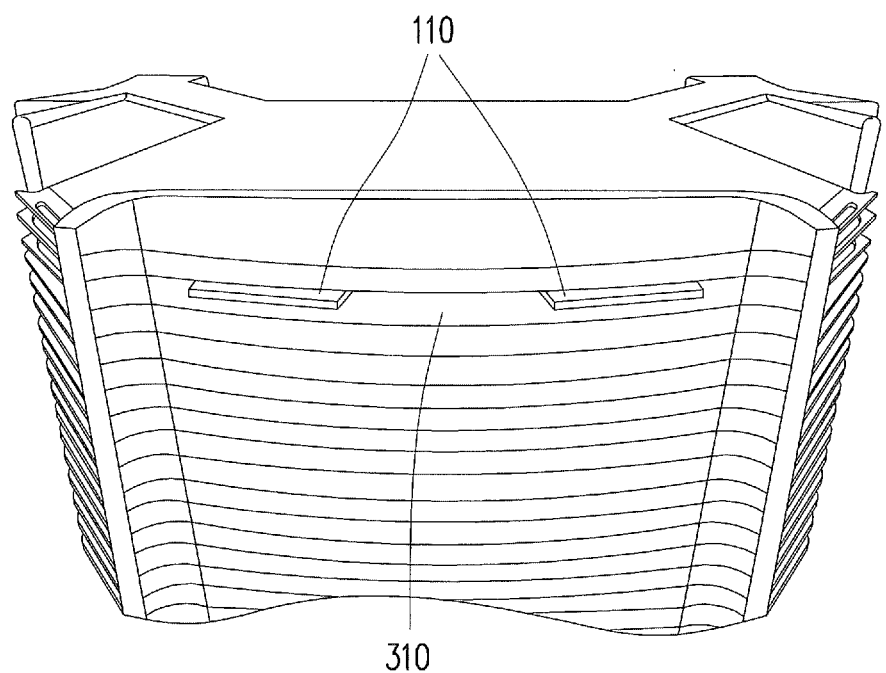
FIG. 3C is a view of various slit openings of the cassette, in accordance with some embodiments.

FIG. 3C is a view of various slit openings of the cassette, in accordance with some embodiments. The forward protrusions 110 of the wafer blade are illustrated within a particular slit opening 310. Also, as illustrated, the cassette may have multiple slit openings 310 arranged in a vertical manner, with one above or below another.

Figure 4A:
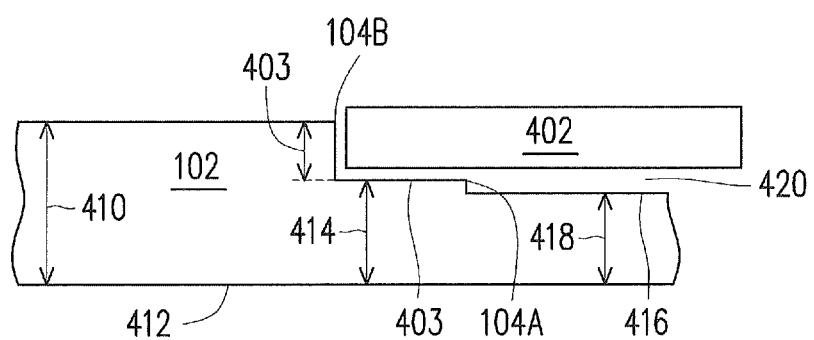
FIG. 4A is a cross sectional diagram of the shiftless wafer blade with a wafer on top, in accordance with some embodiments.

FIG. 4A is a cross sectional diagram of the shiftless wafer blade 102 with a wafer 402 on top, in accordance with some embodiments. The shiftless wafer blade 102 may include the deep wafer pocket 403 which has a depth (e.g., height) that is at least ⅔ of a thickness of the wafer 402. The deep wafer pocket 403 may be part of the contours which define a region in which the wafer 402 may be secured. These contours may include the lower pocket contour 104A and the upper pocket contour 104B. The wafer 402 may rest within the deep wafer pocket between the upper pocket contour 104B and the lower pocket contour 104A. Visualized another way, the upper pocket contour 104B and lower pocket contour 104A may form an outline for two concentric circles where the area between the two concentric circles forms a surface on which a wafer may rest. Also, each of the outside corners as formed by the upper pocket contour 104B and the lower pocket contour 104A may be rounded, or greater than 90 degrees between intersecting surfaces. These outside corners include corners formed of the contour in both a horizontal and a vertical axis, where the vertical axis is orthogonal to the horizontal axis.

Also, as noted above, the shiftless wafer blade 102 may have a thin profile with a thickness 410 that is at most (e.g., at or less than) ⅔ of a height of the slit opening of a cassette. By being at most (e.g., at or less than) ⅔ of a height of the slit opening of a cassette, the shiftless wafer blade 102 may have sufficient clearance to avoid undesirably contacting the cassette due to perturbations (e.g., vibrations or other forces) of a robotic handler in motion. The thickness 410 of the shiftless wafer blade may also be described as a height from the upper pocket contour 104B to the bottom 412 of the shiftless wafer blade 102. The shiftless wafer blade 102 may also have a second thickness 414 that is from the lower pocket contour 104A to the bottom 412 of the shiftless wafer blade 102. Furthermore, the shiftless wafer blade 102 may have a third thickness 418 from a lowest surface 416 to the bottom 412 of the shiftless wafer blade 102. In various embodiments, the opening between the lower pocket contour 104A to the lowest surface 416 of the shiftless wafer blade 102 may be referred to as a lower opening 420. The lower opening 420 may be an open space to prevent the wafer's 402 adherence to the shiftless wafer blade 102 by vacuum forces via providing an air pocket or open space between the shiftless wafer blade 102 and the wafer 402. The lower opening 420 may be laterally surrounded by the deep wafer pocket 403.

Figure 4B:
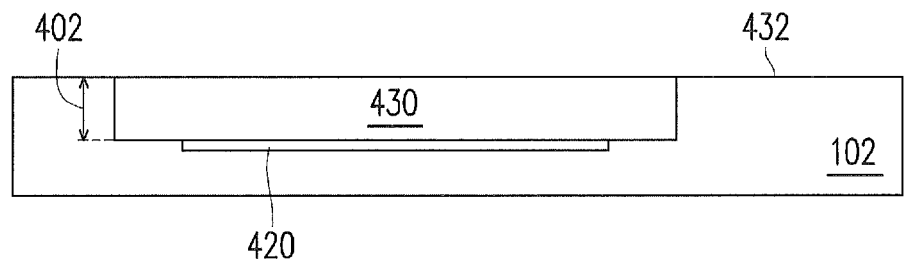
FIG. 4B is a cross sectional diagram of the shiftless wafer blade with a wafer flush with a top surface of the shiftless wafer blade, in accordance with some embodiments.

FIG. 4B is a cross sectional diagram of the shiftless wafer blade 102 with a wafer 430 flush with a top surface 432 of the shiftless wafer blade 102, in accordance with some embodiments. The wafer 430 may sit within the deep wafer pocket 403, which shares a same height (e.g., thickness) as the wafer 430. Accordingly, the deep wafer pocket 403 may have a depth that is at least ⅔ of a thickness of the wafer 402. By having a depth that is at least ⅔ of the thickness of the wafer 402, the wafer 430 may be secure from shifting out of the shiftless wafer blade 102 due to perturbations (e.g., vibrations or other forces) of a robotic handler in motion. Beneath the wafer 430, the lower opening 420 may be an open space to prevent the wafer's 430 adherence to the shiftless wafer blade 102 by vacuum forces, as discussed above.

Figure 4C:
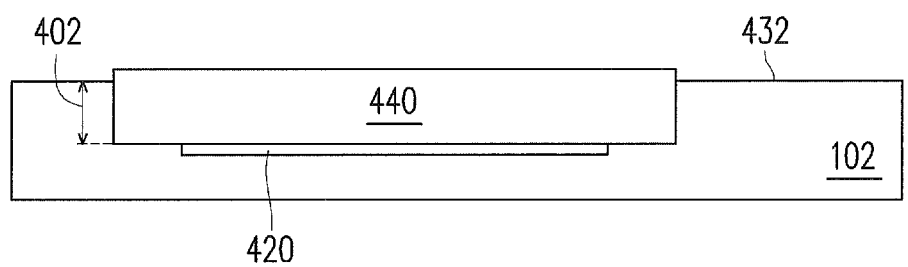
FIG. 4C is a cross sectional diagram of a shiftless wafer blade with a wafer not flush with a top surface of the wafer blade, in accordance with some embodiments.

FIG. 4C is a cross sectional diagram of a shiftless wafer blade 102 with a wafer not flush with a top surface of the wafer blade, in accordance with some embodiments. The wafer 440 may sit within the deep wafer pocket 403, which is not of a same height as the wafer 430. Accordingly, the deep wafer pocket 403 may be at least ⅔ of a thickness of the wafer 440. Beneath the wafer 440, the lower opening 420 may be an open space to prevent the wafer's 440 adherence to the shiftless wafer blade 102 by vacuum forces, as discussed above.

Figure 5A:
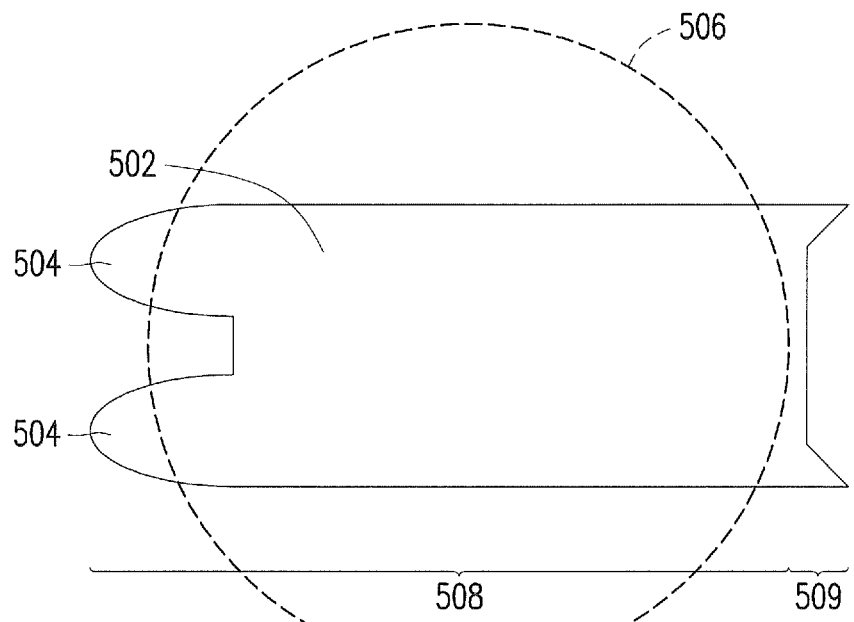
FIG. 5A is a diagram of a shiftless wafer blade that is simply connected, in accordance with some embodiments.

FIG. 5A is a diagram of a shiftless wafer blade 502 that is simply connected, in accordance with some embodiments. Being simply connected describes a topological space without holes such that any loop formed along the topological space can be contracted to a point. The shiftless wafer blade 502 may have no openings but have two rounded forward protrusions 504. A reference outline for a wafer is illustrated in dotted lines 506, from which a contour on the shiftless wafer blade 502 along the reference dotted lines 506 may be configured to secure a wafer on the shiftless wafer blade 502 in a deep wafer pocket during wafer transport.

As noted above, the deep wafer pocket of the shiftless wafer blade 502 may have a depth that is at least ⅔ of a thickness of a wafer configured to sit within the deep wafer pocket. Also, the shiftless wafer blade 502 may have all outside corners of the shiftless wafer blade 502 to an extension depth 508 be greater than 90 degrees between intersecting surfaces. The angles may be measured from within the shiftless wafer blade 502. The intersecting surfaces may refer to a surface of a generally uniform gradient or slope, and the corner may refer to a transition between the surfaces. The extension depth 508 may refer to a depth within a slit opening in which the shiftless wafer blade 502 may extend to retrieve a wafer. The slit opening may be an opening within the cassette in which the wafer that sits within the deep pocket of the shiftless wafer blade 502 may rest. In other embodiments, the shiftless wafer blade 502 may have all exposed outside corners not covered by the robotic handler be greater than 90 degrees between intersecting surfaces. The rear portion 509 of the shiftless wafer blade 502 may be covered by a robotic handler. Lastly, the shiftless wafer blade 502 may have a thin profile that is at most (e.g., at or less than) ⅔ of a height of a slit opening.

Figure 5B:
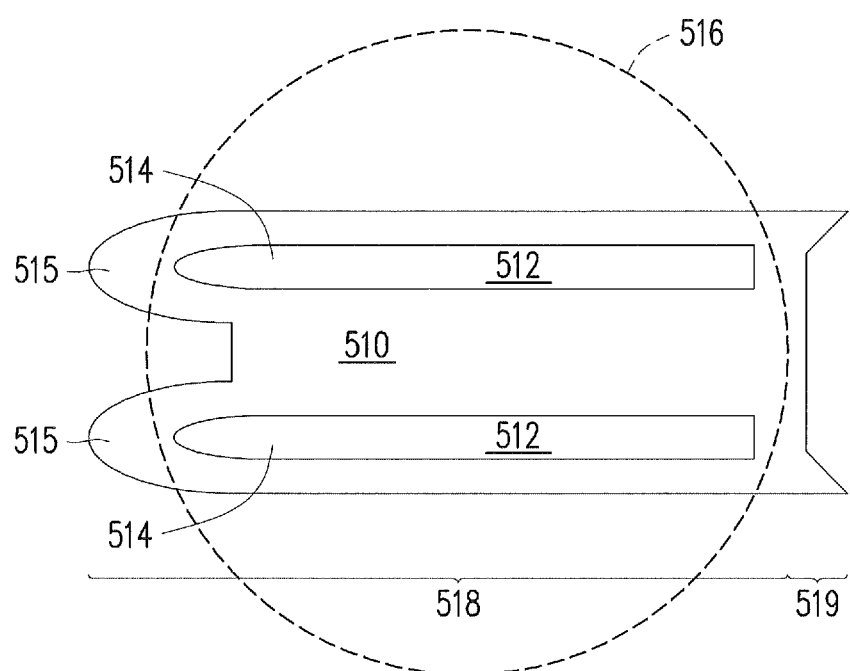
FIG. 5B is a diagram of a shiftless wafer blade with two openings, in accordance with various embodiments.

FIG. 5B is a diagram of a shiftless wafer blade 510 with two openings, 512 in accordance with various embodiments. The two openings 512 may have a rounded portion 514 that extends into part of a forward protrusion 515 of the shiftless wafer blade 510. A reference outline for a wafer is illustrated in dotted lines 516, from which a contour on the shiftless wafer blade 510 along the reference dotted lines 518 may be configured to secure a wafer on the shiftless wafer blade 510 in a deep wafer pocket during wafer transport.

As noted above, the deep wafer pocket of the shiftless wafer blade 510 may have a depth that is at least ⅔ of a thickness of a wafer configured to sit within the deep wafer pocket. Also, the shiftless wafer blade 510 may have all outside corners of the shiftless wafer blade 510 to an extension depth 518 be greater than 90 degrees between intersecting surfaces. The angles may be measured from within the shiftless wafer blade 510. The intersecting surfaces may refer to a surface of a generally uniform gradient or slope, and the corner may refer to a transition between the surfaces. The extension depth 518 may refer to a depth within a slit opening in which the shiftless wafer blade 510 may extend to retrieve a wafer. The slit opening may be an opening within the cassette in which the wafer that sits within the deep pocket of the shiftless wafer blade 510 may rest. In other embodiments, the shiftless wafer blade 510 may have all exposed outside corners not covered by the robotic handler be greater than 90 degrees between intersecting surfaces. The rear portion 519 of the shiftless wafer blade 510 may be covered by a robotic handler. Lastly, the shiftless wafer blade 510 may have a thin profile that is at most (e.g., at or less than) ⅔ of a height of a slit opening.

Figure 5C:
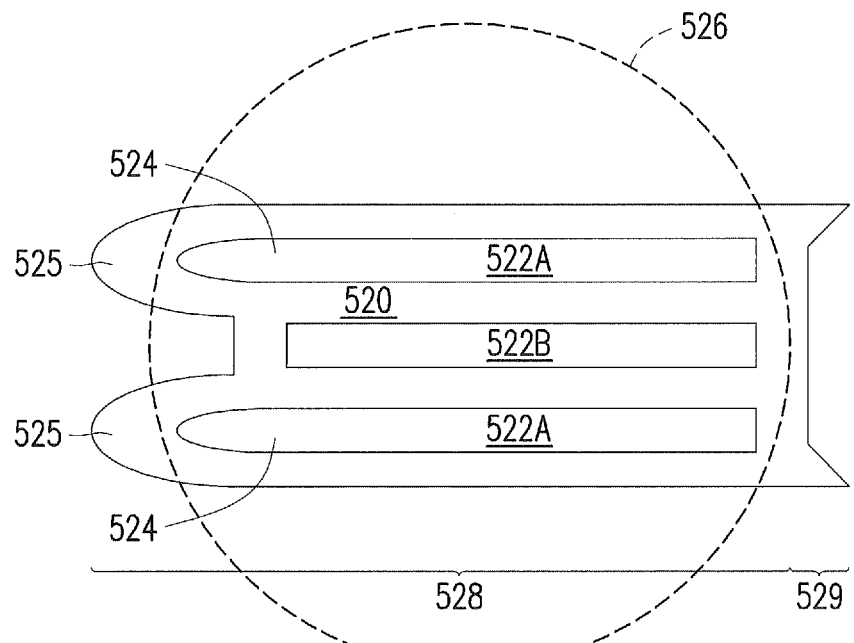
FIG. 5C is a diagram of a shiftless wafer blade with three openings, in accordance with various embodiments.

FIG. 5C is a diagram of a shiftless wafer blade 520 with three openings 522A, 522B, in accordance with various embodiments. Two openings 522A of the three openings 522A, 522B may have a rounded portion 524 that extends into part of a forward protrusion 525 of the shiftless wafer blade. One opening 522B of the three openings may be of a rectangular shape between the two openings 522A. A reference outline for a wafer is illustrated in dotted lines 526, from which a contour on the shiftless wafer blade 520 along the reference dotted lines 528 may be configured to secure a wafer on the shiftless wafer blade 520 in a deep wafer pocket during wafer transport.

As noted above, the deep wafer pocket of the shiftless wafer blade 520 may have a depth that is at least ⅔ of a thickness of a wafer configured to sit within the deep wafer pocket. Also, the shiftless wafer blade 520 may have all outside corners of the shiftless wafer blade 520 to an extension depth be greater than 90 degrees between intersecting surfaces. The angles may be measured from within the shiftless wafer blade 520. The intersecting surfaces may refer to a surface of a generally uniform gradient or slope, and the corner may refer to a transition between the surfaces. The extension depth 528 may refer to a depth within a slit opening in which the shiftless wafer blade 520 may extend to retrieve a wafer. The slit opening may be an opening within the cassette in which the wafer that sits within the deep pocket of the shiftless wafer blade 520 may rest. In other embodiments, the shiftless wafer blade 520 may have all exposed outside corners not covered by the robotic handler be greater than 90 degrees between intersecting surfaces. The rear portion 529 of the shiftless wafer blade 520 may be covered by a robotic handler. Lastly, the shiftless wafer blade 520 may have a thin profile that is at most (e.g., at or less than) ⅔ of a height of a slit opening.

Figure 5D:
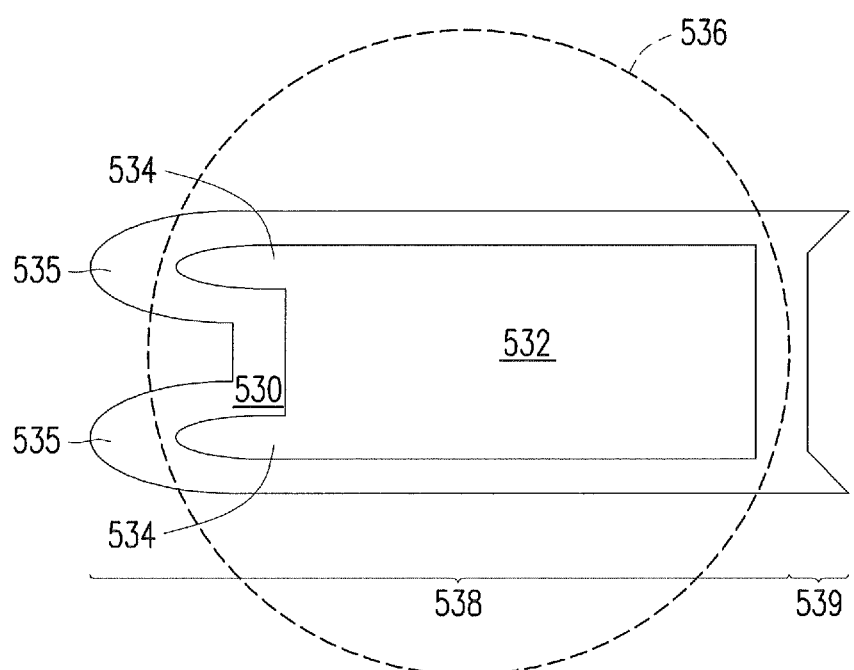
FIG. 5D is a diagram of a shiftless wafer blade with a single opening, in accordance with various embodiments.

FIG. 5D is a diagram of a shiftless wafer blade 530 with a single opening 532, in accordance with various embodiments. The single opening 532 may have rounded portions 534 that extends into part of a forward protrusion 535 of the shiftless wafer blade 530. A reference outline for a wafer is illustrated in dotted lines 536, from which a contour on the shiftless wafer blade 530 along the reference dotted lines 538 may be configured to secure a wafer on the shiftless wafer blade 530 in a deep wafer pocket during wafer transport.

As noted above, the deep wafer pocket of the shiftless wafer blade 530 may have a depth that is at least ⅔ of a thickness of a wafer configured to sit within the deep wafer pocket. Also, the shiftless wafer blade 530 may have all outside corners of the shiftless wafer blade 530 to an extension depth be greater than 90 degrees between intersecting surfaces. The angles may be measured from within the shiftless wafer blade 530. The intersecting surfaces may refer to a surface of a generally uniform gradient or slope, and the corner may refer to a transition between the surfaces. The extension depth 538 may refer to a depth within a slit opening in which the shiftless wafer blade 530 may extend to retrieve a wafer. The slit opening may be an opening within the cassette in which the wafer that sits within the deep pocket of the shiftless wafer blade 530 may rest. In other embodiments, the shiftless wafer blade 530 may have all exposed outside corners not covered by the robotic handler be greater than 90 degrees between intersecting surfaces. The rear portion 539 of the shiftless wafer blade 530 may be covered by a robotic handler. Lastly, the shiftless wafer blade 530 may have a thin profile that is at most (e.g., at or less than) ⅔ of a height of a slit opening.

Figure 5E:
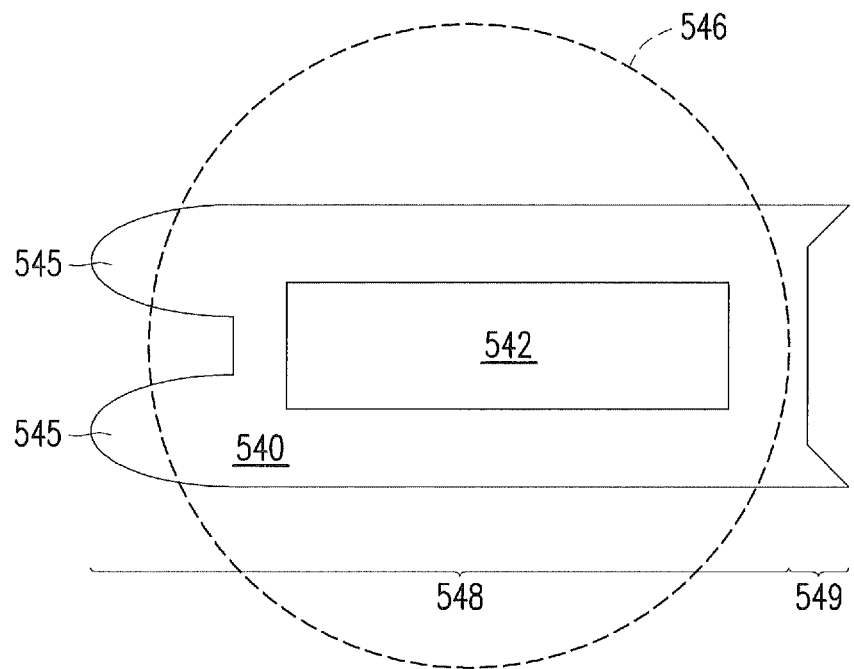
FIG. 5E is a diagram of a shiftless wafer blade with a single rectangular opening, in accordance with various embodiments.

FIG. 5E is a diagram of a shiftless wafer blade 540 with a single rectangular opening 542, in accordance with various embodiments. A reference outline for a wafer is illustrated in dotted lines 546, from which a contour on the shiftless wafer blade 540 along the reference dotted lines 546 may be configured to secure a wafer on the shiftless wafer blade 540 in a deep wafer pocket during wafer transport.

As noted above, the deep wafer pocket of the shiftless wafer blade 540 may have a depth that is at least ⅔ of a thickness of a wafer configured to sit within the deep wafer pocket. Also, the shiftless wafer blade 540 may have all outside corners of the shiftless wafer blade 540 to an extension depth be greater than 90 degrees between intersecting surfaces. The angles may be measured from within the shiftless wafer blade 540. The intersecting surfaces may refer to a surface of a generally uniform gradient or slope, and the corner may refer to a transition between the surfaces. The extension depth 548 may refer to a depth within a slit opening in which the shiftless wafer blade 540 may extend to retrieve a wafer. The slit opening may be an opening within the cassette in which the wafer that sits within the deep pocket of the shiftless wafer blade 540 may rest. In other embodiments, the shiftless wafer blade 540 may have all exposed outside corners not covered by the robotic handler be greater than 90 degrees between intersecting surfaces. The rear portion 549 of the shiftless wafer blade 540 may be covered by a robotic handler. Lastly, the shiftless wafer blade 540 may have a thin profile that is at most (e.g., at or less than) ⅔ of a height of a slit opening.

Figure 5F:
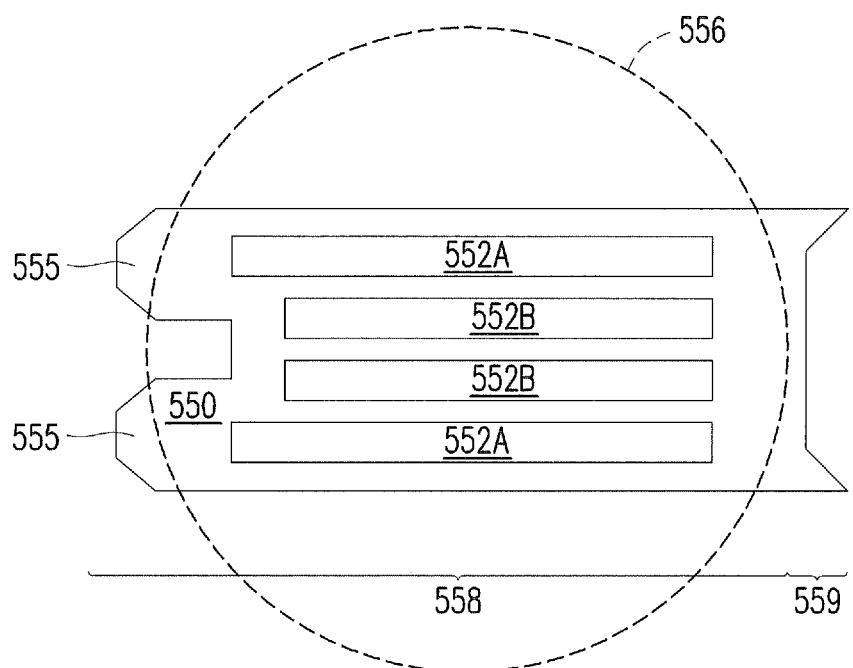
FIG. 5F is a diagram of a shiftless wafer blade with four rectangular openings, in accordance with various embodiments.

FIG. 5F is a diagram of a shiftless wafer blade 550 with four rectangular openings 552A, 552B, in accordance with various embodiments. Two outer openings 552A of the four rectangular openings 552A, 552B may be longer than two inner openings 552B but not extend into a forward protrusion 555 of the shiftless wafer blade. The two inner openings 552B may have a same width but not a same length as the two outer openings 552A and be between the two outer openings 552A. A reference outline for a wafer is illustrated in dotted lines 556, from which a contour on the shiftless wafer blade 550 along the reference dotted lines 556 may be configured to secure a wafer on the shiftless wafer blade 550 in a deep wafer pocket during wafer transport.

As noted above, the deep wafer pocket of the shiftless wafer blade 550 may have a depth that is at least ⅔ of a thickness of a wafer configured to sit within the deep wafer pocket. Also, the shiftless wafer blade 550 may have all outside corners of the shiftless wafer blade 550 to an extension depth be greater than 90 degrees between intersecting surfaces. The angles may be measured from within the shiftless wafer blade 550. The intersecting surfaces may refer to a surface of a generally uniform gradient or slope, and the corner may refer to a transition between the surfaces. The extension depth 558 may refer to a depth within a slit opening in which the shiftless wafer blade 550 may extend to retrieve a wafer. The slit opening may be an opening within the cassette in which the wafer that sits within the deep pocket of the shiftless wafer blade 550 may rest. In other embodiments, the shiftless wafer blade 550 may have all exposed outside corners not covered by the robotic handler be greater than 90 degrees between intersecting surfaces. The rear portion 559 of the shiftless wafer blade 550 may be covered by a robotic handler. Lastly, the shiftless wafer blade 550 may have a thin profile that is at most (e.g., at or less than) ⅔ of a height of a slit opening.

Figure 5G:
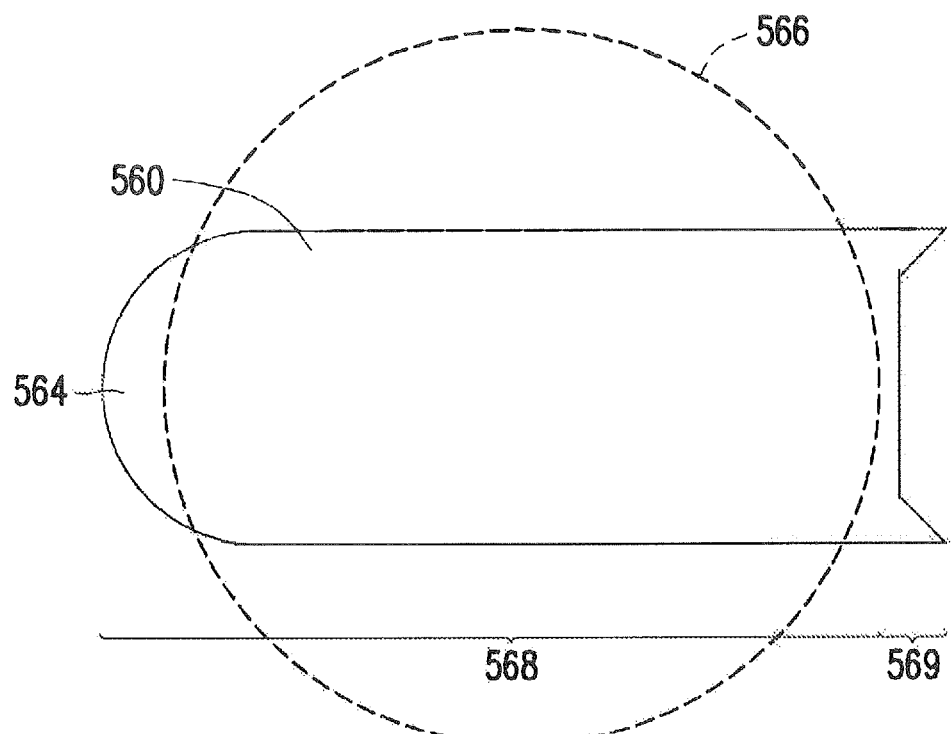
FIG. 5G is a diagram of a shiftless wafer blade with a single rounded forward protrusion, in accordance with various embodiments.

FIG. 5G is a diagram of a shiftless wafer blade 560 with a single rounded forward protrusion 564, in accordance with various embodiments. The shiftless wafer blade 560 may also be simply connected without openings. The shiftless wafer blade 502 may have the single rounded protrusion 564. A reference outline for a wafer is illustrated in dotted lines 566, from which a contour on the shiftless wafer blade 560 along the reference dotted lines 566 may be configured to secure a wafer on the shiftless wafer blade 560 in a deep wafer pocket during wafer transport.

As noted above, the deep wafer pocket of the shiftless wafer blade 560 may have a depth that is at least ⅔ of a thickness of a wafer configured to sit within the deep wafer pocket. Also, the shiftless wafer blade 560 may have all outside corners of the shiftless wafer blade 560 to an extension depth be greater than 90 degrees between intersecting surfaces. The angles may be measured from within the shiftless wafer blade 560. The intersecting surfaces may refer to a surface of a generally uniform gradient or slope, and the corner may refer to a transition between the surfaces. The extension depth 568 may refer to a depth within a slit opening in which the shiftless wafer blade 560 may extend to retrieve a wafer. The slit opening may be an opening within the cassette in which the wafer that sits within the deep pocket of the shiftless wafer blade 560 may rest. In other embodiments, the shiftless wafer blade 560 may have all exposed outside corners not covered by the robotic handler be greater than 90 degrees between intersecting surfaces. The rear portion 569 of the shiftless wafer blade 560 may be covered by a robotic handler. Lastly, the shiftless wafer blade 560 may have a thin profile that is at most (e.g., at or less than) ⅔ of a height of a slit opening.

Figure 5H:
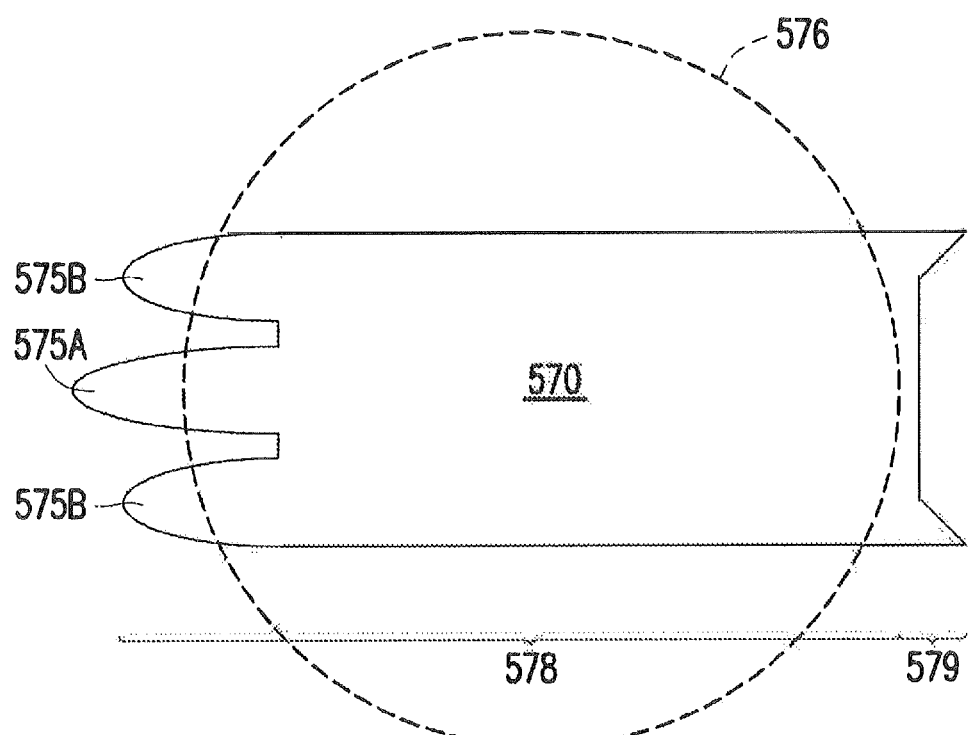
FIG. 5H is a diagram of a shiftless wafer blade with three forward protrusions, in accordance with various embodiments.

FIG. 5H is a diagram of a shiftless wafer blade 570 with three forward protrusions 575A, 575B, in accordance with various embodiments. A single central forward protrusion 575A may extend longer than and be flanked by two outer forward protrusions 575B. The shiftless wafer blade 570 may also be simply connected without openings. A reference outline for a wafer is illustrated in dotted lines 576, from which a contour on the shiftless wafer blade 570 along the reference dotted lines 576 may be configured to secure a wafer on the shiftless wafer blade 570 in a deep wafer pocket during wafer transport.

As noted above, the deep wafer pocket of the shiftless wafer blade 570 may have a depth that is at least ⅔ of a thickness of a wafer configured to sit within the deep wafer pocket. Also, the shiftless wafer blade 570 may have all outside corners of the shiftless wafer blade 570 to an extension depth be greater than 90 degrees between intersecting surfaces. The angles may be measured from within the shiftless wafer blade 570. The intersecting surfaces may refer to a surface of a generally uniform gradient or slope, and the corner may refer to a transition between the surfaces. The extension depth 578 may refer to a depth within a slit opening in which the shiftless wafer blade 570 may extend to retrieve a wafer. The slit opening may be an opening within the cassette in which the wafer that sits within the deep pocket of the shiftless wafer blade 570 may rest. In other embodiments, the shiftless wafer blade 570 may have all exposed outside corners not covered by the robotic handler be greater than 90 degrees between intersecting surfaces. The rear portion 579 of the shiftless wafer blade 570 may be covered by a robotic handler. Lastly, the shiftless wafer blade 570 may have a thin profile that is at most (e.g., at or less than) ⅔ of a height of a slit opening.

Figure 6:
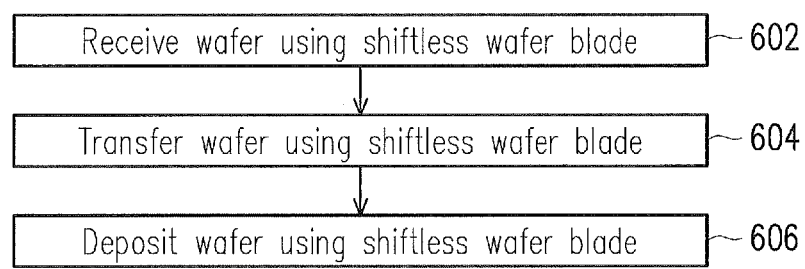
FIG. 6 is a flow chart of a shiftless wafer blade transfer process, in accordance with some embodiments.

FIG. 6 is a flow chart of a shiftless wafer blade transfer process 600, in accordance with some embodiments. The wafer blade transfer process 600, may be performed by a wafer transfer system, as introduced above. It is noted that the process 600 is merely an example, and is not intended to limit the present disclosure. Accordingly, it is understood that additional operations may be provided before, during, and after the process 600 of FIG. 6, certain operations may be omitted, certain operations may be performed concurrently with other operations, and that some other operations may only be briefly described herein.

At operation 602, a shiftless wafer blade may receive a wafer. The wafer may be received, for example, within a slit opening of a cassette and/or a chamber. As noted above, the chambers may be, for example, a process chambers or a cooling chamber. Examples of processing chambers may include an etching chamber, a physical vapor deposition chamber), a sputtering chamber, a chemical vapor deposition chamber, and the like. Also, in order to receive the wafer, the shiftless wafer blade may be extended into the cassette and/or extended into the chamber. When extended into the cassette the shiftless wafer blade may have a certain amount of clearance both above and below the shiftless wafer blade. In certain embodiments, the wafer may be moved in the slit opening and/or chamber from a lower position to an upper position via pins to extend above the shiftless wafer blade and then be lowered onto the shiftless wafer blade within the deep wafer pocket of the shiftless wafer blade. The movement of the wafer within the slit opening onto the shiftless wafer blade may be performed in a conventional manner and will not be discussed in further detail herein.

At operation 604, the shiftless wafer blade may transfer the wafer. As noted above, the shiftless wafer blade may be connected with, and moved by, a robotic handler. The robotic handler may handle the wafer transfer by a single, planar, two-axis, random access, cassette-to-cassette motion or a cassette-to-chamber motion.

At operation 606, the wafer may be deposited using the shiftless wafer blade. Similar to being received, the wafer may be deposited, for example, within a slit opening of a cassette and/or a chamber. In certain embodiments, the shiftless wafer blade may be extended into the slit opening of the cassette and/or extended into the chamber. The wafer may be moved in the slit opening and/or chamber from a lower position to an upper position via pins to extend above and off the shiftless wafer blade and then be lowered within the cassette and/or chamber. The movement of the wafer within the slit opening onto the shiftless wafer blade may be performed in a conventional manner and will not be discussed in further detail herein.

In an embodiment, a system includes: a cassette comprising a slit opening configured to house a wafer; a blade configured to move the wafer to and from the slit opening by extending into the slit opening, wherein a blade thickness of the blade is at most ⅔ of a height of the slit opening and wherein the blade is configured to secure the wafer within a pocket on the blade that is at least ⅔ of a wafer thickness of the wafer.

In another embodiment, a system includes: a cassette comprising a slit opening configured to house a wafer; a blade configured to move the wafer to and from the slit opening by extending into the slit opening by an extension depth as measured from an extreme end of the blade, wherein the blade is configured to secure the wafer within a contour on the blade; wherein each corner of the blade within the extension depth is rounded.

In another embodiment, a method includes: extending a blade into a slit opening of a cassette, wherein a blade thickness of the blade is at most ⅔ of a height of the slit opening; securing a wafer on the blade within the slit opening, wherein the blade is configured to secure the wafer within a pocket on the blade that is at least ⅔ of a wafer thickness of the wafer; transporting the wafer on the blade from the slit opening to a processing chamber; and depositing the wafer in the processing chamber.

The foregoing outlines features of several embodiments so that those of ordinary skill in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device.

A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
a cassette comprising a slit opening configured to house a wafer; and
a blade configured to move the wafer to and from the slit opening by extending into the slit opening, wherein the blade is configured to secure the wafer within a contoured pocket on the blade, and
wherein the blade further comprises:
a first forward protrusion with rounded corners;
a second forward protrusion with rounded corners, the second forward protrusion extending parallel to the first forward protrusion;
a first opening having a portion that extends into a part of the first forward protrusion; and
a second opening having a portion that extends into a part of the second forward protrusion,
wherein the blade further comprises an upper pocket contour and a lower pocket contour, wherein the upper pocket contour and lower pocket contour form an outline of two concentric circles where an area between the two concentric circles forms a wafer pocket on which the wafer rests, and wherein each of the upper and lower pocket contours comprises rounded vertical outside corners and rounded horizontal outside corners.

2. The system of claim 1, wherein:
the blade is configured to move the wafer to and from the slit opening by extending into the slit opening by an extension depth as measured from an extreme end of the blade, and
each corner of the blade within the extension depth is rounded.

3. The system of claim 1, wherein:
the blade comprises a first part and a second part, wherein the second part is covered by a robotic handler and each corner of the blade within the first part is rounded.

4. The system of claim 1, wherein the pocket is between a first thickness of the blade and a second thickness of the blade that is thinner than the first thickness.

5. The system of claim 1, wherein the blade comprises one of: quartz, steel, a ceramic, aluminum oxide, and an aluminum alloy.

6. The system of claim 1, wherein the cassette comprises multiple uniform slit openings and the slit opening is one of the multiple uniform slit openings.

7. The system of claim 1, wherein the wafer pocket has a depth that is at least two-thirds of a thickness of the wafer.

8. A system, comprising:
a cassette comprising a slit opening configured to house a wafer; and
a blade configured to move the wafer to and from the slit opening by extending into the slit opening by an extension depth as measured from an extreme end of the blade, wherein the blade is configured to secure the wafer within a contour on the blade, and
wherein the blade comprises a pocket contour defining an area in which the wafer rests,
wherein the pocket contour comprises rounded vertical outside corners and rounded horizontal outside corners, and
wherein the blade further comprises an upper pocket contour and a lower pocket contour, wherein the upper pocket contour and lower pocket contour form an outline of two concentric circles where an area between the two concentric circles forms a wafer pocket on which the wafer rests, and wherein each of the upper and lower pocket contours comprises rounded vertical outside corners and rounded horizontal outside corners.

9. The system of claim 8, wherein a thickness of the blade is at most ⅔ of a height of the slit opening.

10. The system of claim 8, wherein the blade comprises a first thickness and a second thickness, which is thinner than the first thickness, wherein a height difference between the first thickness and the second thickness is at least ⅔ of a thickness of the wafer.

11. The system of claim 10, wherein the blade comprises a third thickness, which is thinner than the second thickness.

12. The system of claim 11, wherein the third thickness is laterally surrounded by the second thickness.

13. The system of claim 8, wherein the blade forms a simply connected topological space.

14. The system of claim 8, wherein the wafer is flush with a surface of the blade while resting within the contour of the blade.

15. The system of claim 8, wherein the wafer protrudes from the blade while resting within the contour of the blade.

16. A method, comprising:
extending a blade into a slit opening of a cassette;
securing a wafer on the blade within the slit opening, wherein the blade is configured to secure the wafer within a pocket on the blade, wherein the blade comprises at least one pocket contour forming at least a partial outline of a circle defining an area in which the wafer rests, wherein the at least one pocket contour comprises rounded vertical outside corners and rounded horizontal outside corners, and wherein the blade further comprises at least one forward protrusion with rounded corners and at least one opening having a portion that extends into a part of the at least one forward protrusion, respectively;
transporting the wafer on the blade from the slit opening to a processing chamber; and
depositing the wafer in the processing chamber.

17. The method of claim 16, wherein:
the blade is configured to extend into the slit opening by an extension depth as measured from an extreme end of the blade, and
each corner of the blade within the extension depth is rounded.

18. The method of claim 16, wherein:
the blade comprises a first part and a second part, wherein the second part is covered by a robotic handler and each corner of the blade within the first part is rounded.

19. The method of claim 16, wherein the pocket is between a first thickness of the blade and a second thickness of the blade that is thinner than the first thickness.

20. The method of claim 16, wherein the blade comprises one of: quartz, steel, a ceramic, aluminum oxide, and an aluminum alloy.

* * * * *